(12) United States Patent
Chen

(10) Patent No.: US 7,579,857 B2
(45) Date of Patent: Aug. 25, 2009

(54) ELECTRICAL CONTACT DEVICE OF PROBE CARD

(75) Inventor: Chih-Chung Chen, Taipei (TW)

(73) Assignee: MPI Corporation, Hsinchu Shien (TW)

( * ) Notice: Subject to any disclaimer, the term of this patent is extended or adjusted under 35 U.S.C. 154(b) by 268 days.

(21) Appl. No.: 11/505,407

(22) Filed: Aug. 17, 2006

(65) Prior Publication Data

US 2007/0045535 A1    Mar. 1, 2007

(30) Foreign Application Priority Data

Aug. 29, 2005    (TW) .............................. 94129539 A

(51) Int. Cl.
- *G01R 1/073* (2006.01)
- *H05K 3/00* (2006.01)
- *B44C 1/22* (2006.01)

(52) U.S. Cl. .................... 324/762; 29/846; 216/11; 324/754

(58) Field of Classification Search ......... 324/754–765; 29/825, 846; 216/11
See application file for complete search history.

(56) References Cited

U.S. PATENT DOCUMENTS

| | | | | |
|---|---|---|---|---|
| 5,923,178 A | * | 7/1999 | Higgins et al. | 324/754 |
| 6,504,388 B2 | * | 1/2003 | Comulada et al. | 324/754 |
| 6,967,493 B2 | * | 11/2005 | Mori et al. | 324/754 |
| 7,265,562 B2 | * | 9/2007 | Chen et al. | 324/754 |

* cited by examiner

*Primary Examiner*—Ernest F Karlsen
(74) *Attorney, Agent, or Firm*—Browdy and Neimark, P.L.L.C.

(57) ABSTRACT

An electrical contact device of a probe card includes a base and probes on the base. The base has a top side with a cavity thereon, and the cavity has sidewalls connected to the top side. Anchored portion are provided on the sidewalls of the cavity. Each of the probes has a first end and a second end, wherein the first end is connected to the anchored portion, and the second end is extended toward the cavity respectively.

26 Claims, 9 Drawing Sheets

ELECTRICAL CONTACT DEVICE OF PROBE CARD

BACKGROUND OF THE INVENTION

1. Field of the Invention

The present invention relates generally to a probe card and more particularly to an electrical contact device of a probe card with good reliability.

2. Description of the Related Art

In the process of fabrication of semiconductor chips, the chips have to be tested for the circuited function prior to package process. The testing procedure provides an electrical contact between the machine and the chips via an electrical contact device, such as probe card. The electrical contact device has probes in contact with the pads of the chip. The machine provides signals to the chip via the probe card, and the signals feedback to the machine to qualify the chip.

A prior art of electrical contact device 80, as shown in FIG. 28, includes a base 81 and probes 82 on the base 81. Each of the probes has a first end 83 bonded to the base 81 and a second end 84 extended over a cavity 85 on the base 81. The second ends 84 of the probes 82 are adapted to contact pads of a chip. Because the second ends 84 of the probes 82 are suspended, it provides the probes 82 with elasticity. With the elasticity, the probes 82 can keep in contact with the pads of the chip.

Another prior art of electrical contact device is shown in FIG. 29, which includes a base 91 and probes 92 also. The probes 92, directly formed on the base 91, have first ends 93 connected to the base 92 and second ends 94 extended over a cavity 95 on the base 91. The probes 92 have elasticity also to contact pads of a chip at the second ends 94 thereof.

However, the size of the semiconductor chips are becoming smaller and the amount of the pads is drastically increasing, so that the density of the probes of the electrical contact device should be higher than before so as to meet the increasing amount and the shrinking size of pads. In terms of the denser population of probes, each suspended probe has to shrink the portions connected to the base consequently. Therefore, during the long-term testing procedure and repeating contact, the connective portions of the probes are inclined to crack and to rip off from the base so as to cause malfunction of the electrical contact device and lower the reliability of probe card.

SUMMARY OF THE INVENTION

The primary objective of the present invention is to provide an electrical contact device of a probe card, which the probes are firmly connected to the base with a strong structure. As a result, the probes are more robust during testing, and the electrical contact device could be more reliable thereof.

According to the objective of the present invention, an electrical contact device of a probe card comprises a base having a top side with a cavity thereon, wherein the cavity has at least a sidewall adjacent to the side, on which at least an anchored portion is provided and at least a probe having a first end and a second end, wherein the first end is connected to the anchored portion, and the second end is extended toward the cavity. The present invention reveals a partially embedded suspended probe on the base to increase the conjunction strength with the base. As a result, the lifetime of probes can sustain longer, as well as the higher reliability of the electrical contact device.

DETAILED DESCRIPTION OF THE INVENTION

Figure 1:
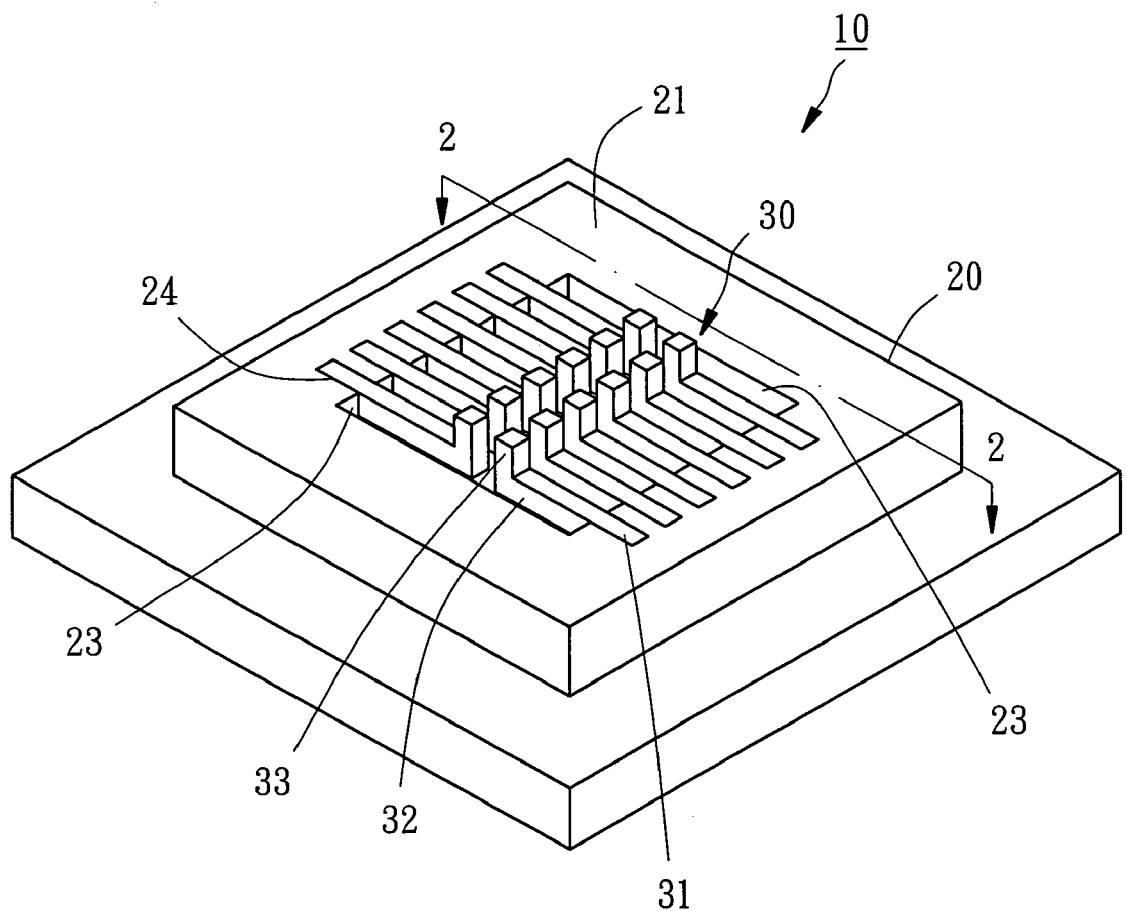
FIG. 1 is a perspective view of a first preferred embodiment of the present invention.
Figure 2:
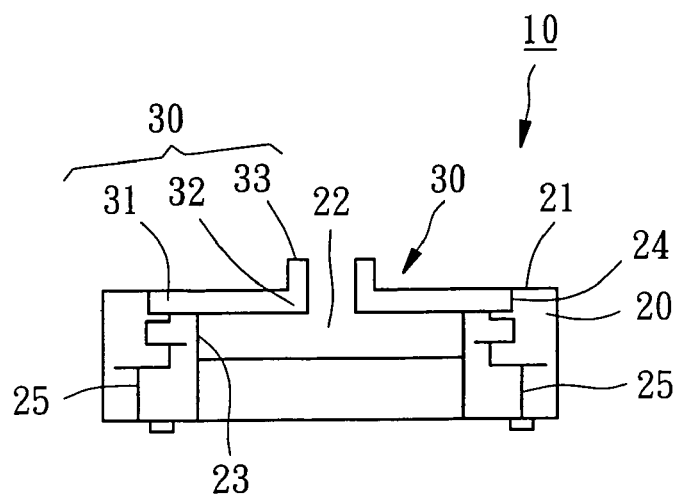
FIG. 2 is a sectional view along the 2-2 line of FIG. 1.

As shown in FIG. 1 and FIG. 2, the first preferred embodiment of the present invention provides an electrical contact device 10 for a probe card, which comprises a base 20 and probes 30. The base 20 has a top side 21, on which a cavity 22 is provided. The cavity 22 is enclosed by four sidewalls 23 adjacent to the topside 21. On two of the opposite sidewalls 23, anchored portions 24 are provided respectively, each of which is a recess on the sidewall 23 and the topside 21 as well. Moreover, the conductive traces 25 are formed in the base 20.

The probes 30 are cantilever beams made of a conductive material, each of which has a first end 31 and a second end 32. The first ends 31 are complementary to the anchored portions 24 of the base 20. Each of the second ends 32 has a vertical contacting portion 33. The probes 30 have the first ends 31 engaged with the anchored portions 24 of the base 20 and are located at a level identical to the topside 21 and are electrically connected to the conductive traces 25. The second ends 32 are extended toward the cavity 22, and the contacting portions 33 point upward.

Figure 3:
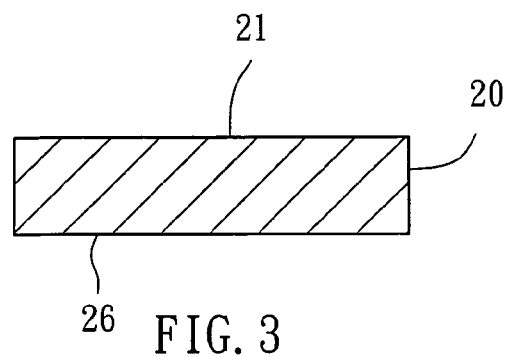
FIG. 3 to FIG. 8 are flow diagrams showing making the electrical contact device of the first preferred embodiment of the present invention.

FIG. 3 to FIG. 8 show a process to fabricate the electrical contact device 10 of the first preferred embodiment of the present invention, including:

Step 1: as shown in FIG. 3, preparing a silicon base 20 with a top side 21 and a bottom side 26.

Figure 4:
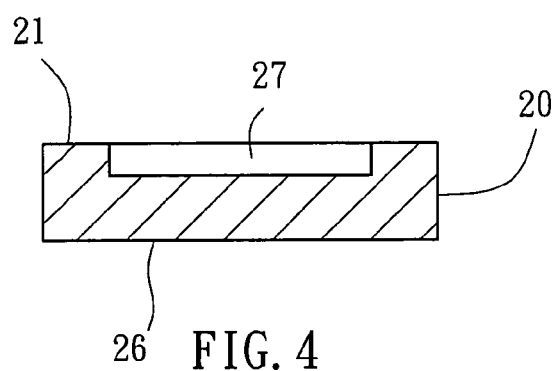

Step 2: as shown in FIG. 4, forming a first concave space 27 on the top side 21 of the base 20 by etching or laser machining.

Figure 5:
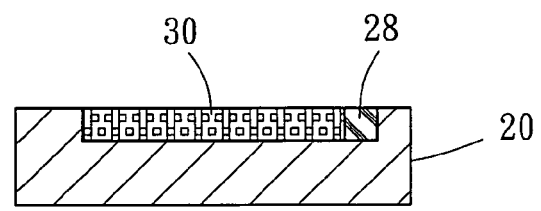
Figure 6:
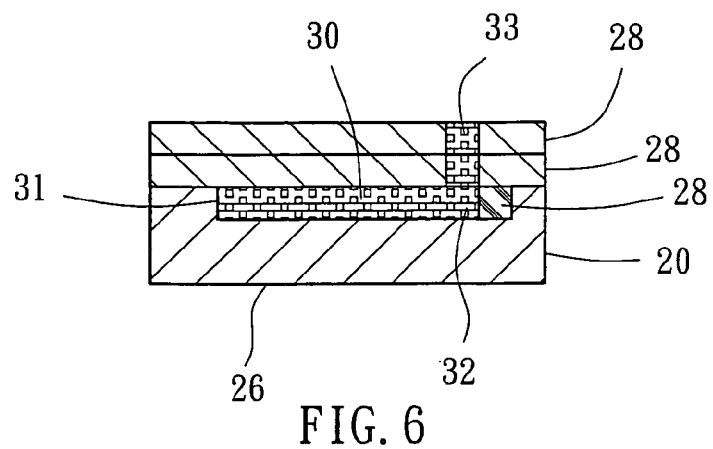

Step 3: as shown in FIG. 5 and FIG. 6, probes 30 and sacrificial layer 28 are formed within the first space 27 and the top side 21 by photolithography and electroforming processes. The probes 30 have first ends 31 and second ends 32. Each second end 32 has a contact portion 33. To precisely control the thickness of the probes 30, grinding and polishing the probes 30 can be performed following the electroforming process. The grinding process controls the probes 30 to a desirable thickness, while the polishing process smoothes the surfaces of the probes 30.

Figure 7:
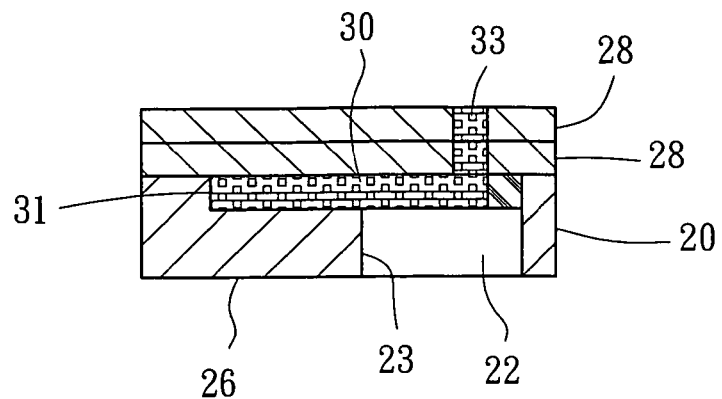

Step 4: as shown in FIG. 7, etch the substrate 20 from the bottom side 26 via anisotropic etching or chemical wet etching to form a cavity 22 (second space) below the second ends 32 of the probes 30.

Figure 8:
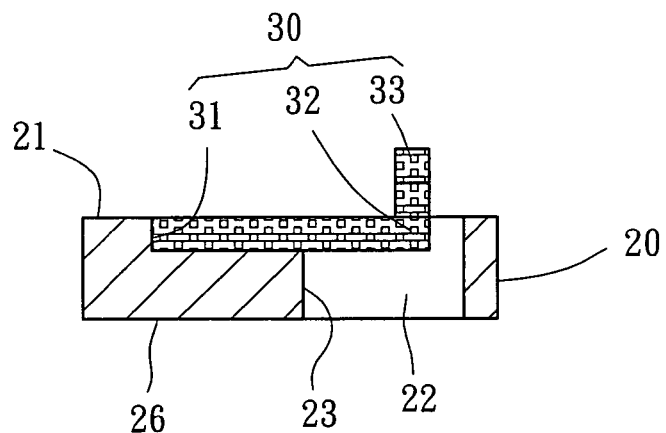

Step 5: as shown in FIG. 8, removing the sacrifice layers 28 to release the probes 30, which have the first ends 31 connected to the substrate 20 and the second ends 32 extended toward the cavity 22 (second space).

Except for silicon, the substrate 20 may be silicon on insulator (SOI) base, dielectric base, or base with dielectric material on the surface. Before electroforming the probes 30, the base 20 can be blanketed with dielectric material on the surface underlying the probes 30 to keep the probe in insulating condition. The ways of providing the dielectric material on the substrate include the chemical deposition of silicon dioxide, silicon nitride, and so forth or thermal oxidation in furnace.

Figure 9:
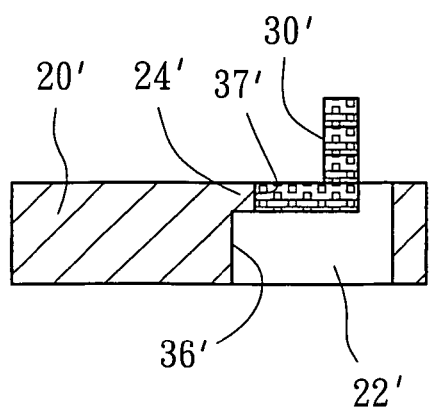
FIG. 9 is a sectional view of an application of the first preferred embodiment of the present invention.

As shown in FIG. 7 and FIG. 8, owing to the difficult control of dimension of the cavity 22 by etching through the substrate 20 from the bottom side 26, the position of the suspension boundary 23, which dominates the variation of both elasticity and contact resistance of the probes 30, is therefore not easy to be precisely controlled either. To achieve less variation of both elasticity and contact resistance of the probes 30, a larger cavity 22 under the probes 30 and a first side wall 36' in the cavity 22 receded from a second side wall 37' are provided. As shown in FIG. 9, each suspended probe 30 is clamped by the anchored portion 24' and the position of second side wall 37' represents the dominated suspension boundary of the probes 30. The second side wall 37' can be shaped by anisotropic etching from the topside 21 with more accurate pattern and less etching deviation, while the first side wall 36' in the cavity 22 can be etched by anisotropic etching either from the backside 26 or the front side 21. Thus, the probes 30 clamped by the anchored portion 24' with the accurately defined second side wall 37' can achieve consistent resilience and steady contact resistance of said probe 30.

As the description, when the electrical contact device 10 is applied to a probe card (not shown), the contacting portions 33 of the probes are in contact with the pads of a chip. The chip presses the second ends 32 of the probes 30 downward to move the second ends 32 of the probes 30 toward the cavity 22, and the probes 30 are bent. The probes 30 have the first ends 31 fixed to the anchored portions 24 of the base 20 that provide the probes 30 with elasticity to contact the pads tightly. In addition, with the structure of the anchored portions 24 bonded to the probes 30, the probes 30 have larger area bonded to the base 20 so as to be capable of taking more strength to prevent the probes 30 from separation from the base 20 with repeatedly touchdown on the pads of the chips.

Therefore, the present invention provides a strong structure between the probes and the base that can prevent the probes from damage after long-term testing process. That is, the present invention prevents the electrical contact device 10 from malfunction and enhances the reliability of the same as well.

Figure 10:
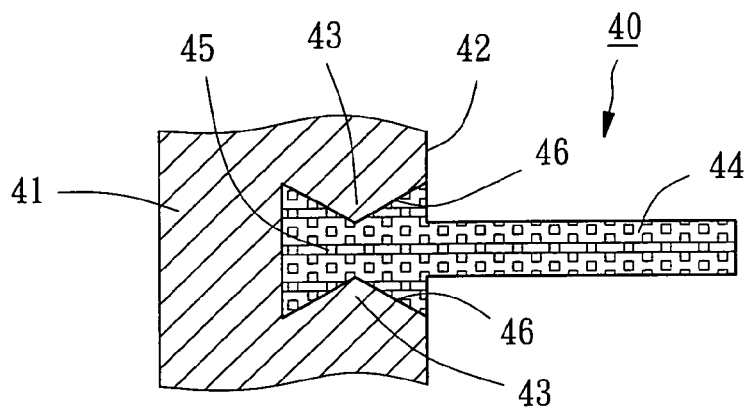
FIG. 10 is a top plan view in part of a second preferred embodiment of the present invention, showing the connection of the probes and the base.

There are many equivalent structures of the electrical contact device of the present invention. FIG. 10 shows an electrical contact device 40 of the second preferred embodiment of the present invention, which is similar to the electrical contact device 10 of the first preferred embodiment, except that a base 40 has anchored portions 42, each of which has two protrusions 43 at two sides thereof. The protrusions 43 are convex portions on the anchored portions 42. Probes 44 have first ends 45, each of which has two indentations 46 on two exterior circumferences thereof. The indentations 46 are concave portions on the Probes 44. The protrusions 43 of the base 41 are engaged with the indentations 46 of the probes 44 to bond the probes 44 to the base 41.

Figure 11:
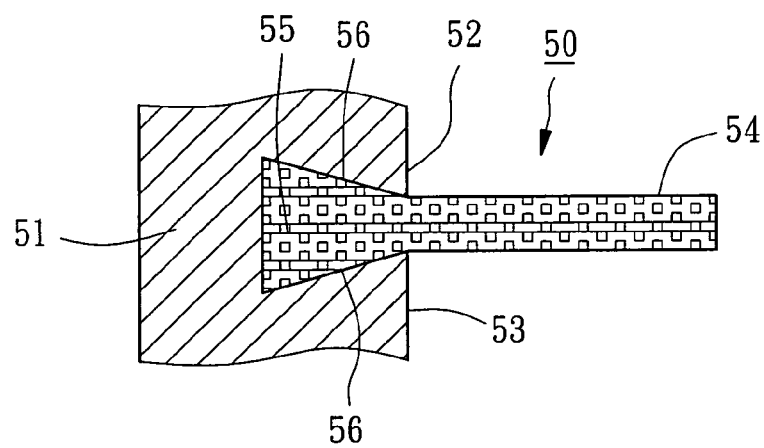
FIG. 11 is a top plan view in part of a third preferred embodiment of the present invention, showing the connection of the probes and the base.

As shown in FIG. 11, the third preferred embodiment of the present invention provides an electrical contact device 50, which has a base 51 with anchored portions 52 having two lateral sidewalls 56 radially and inwardly extended from an exterior side 53 of the anchored portions 52. Probes 54 have first ends 55 with shapes complementary to the anchored portions 52, so that the first ends 55 of the probes 54 can engaged with the anchored portions 52 along the lateral sidewalls 56 respectively, and the main of the probes 54 are extended out of the exterior side 53.

Figure 12:
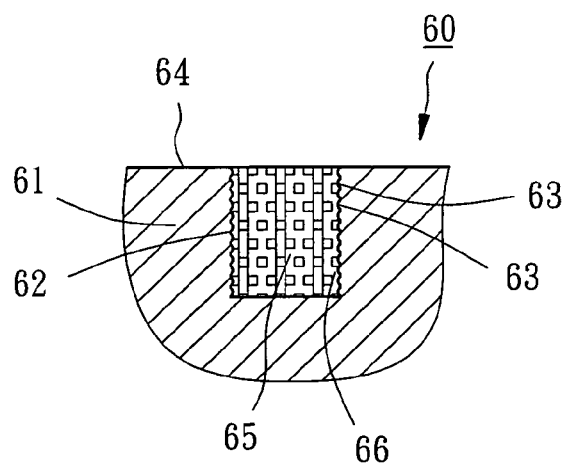
FIG. 12 is a sectional view in part of a fourth preferred embodiment of the present invention, showing the connection of the probes and the base.
Figure 13:
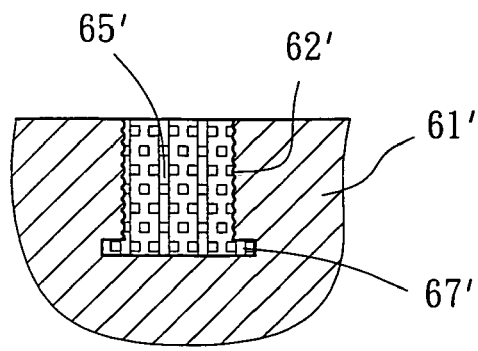
FIG. 13 is a sectional view of an application of the fourth preferred embodiment of the present invention.
Figure 14:
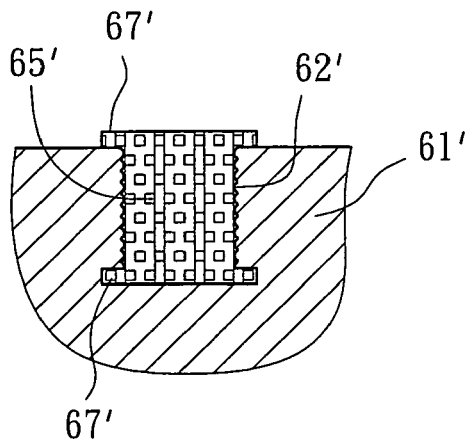
FIG. 14 is a sectional view of another application of the fourth preferred embodiment of the present invention.

As shown in FIG. 12, an electrical contact device 60 of the fourth preferred embodiment of the present invention, which a base 61 has anchored portions 62, each of which has recesses 63 on two lateral sides thereof. The recesses 63 are parallel to a top side 64 of the base 61. Probes 65 have flanges 65 parallel to the top side 64. The probes 65 are fixed to the anchored portions 62 of the base 61 by engaging the flanges 65 with the recesses 63. As shown in FIG. 13 and FIG. 14, probes 651 are provided with a head portion 671 on a top or a at bottom side thereof. The probes 651 are engaged with anchored portions 621 of the base 61. It increases the bonding strength of the probes 651 and the base 61. The head portions 671 on the bottom side of the probes 651 can be made by an isotropic etching following the anisotropic etching of the space complementary to the figure of probes 65. Then use electroforming to fill the aforesaid spaces of the probes 65 with the head portions 671. On the other hand, using photo etching and micro electroforming stacking thereon can make the head portions 671 on the top of the probes 651.

Figure 15:
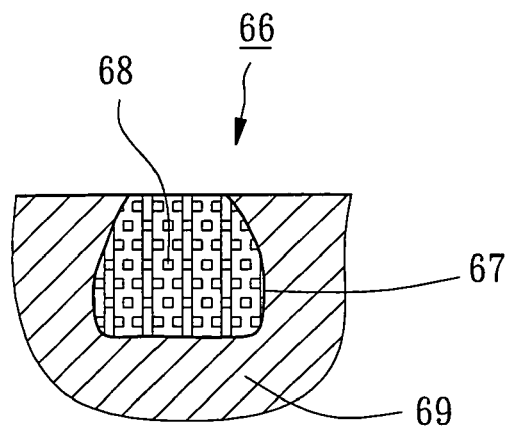
FIG. 15 is a sectional view in part of a fifth preferred embodiment of the present invention, showing the connection of the probes and the base.

As shown in FIG. 15, an electrical contact device 66 of the fifth preferred embodiment of the present invention, which has anchored portions 67 with irregular cross-sections and probes 68 having shapes complementary to the anchored portions 67 for bonding the probes 68 to a base 69. It is noted that the variation of the dimension among the probes 68 should be smaller so as to keep the electric specification in normal.

Figure 16:
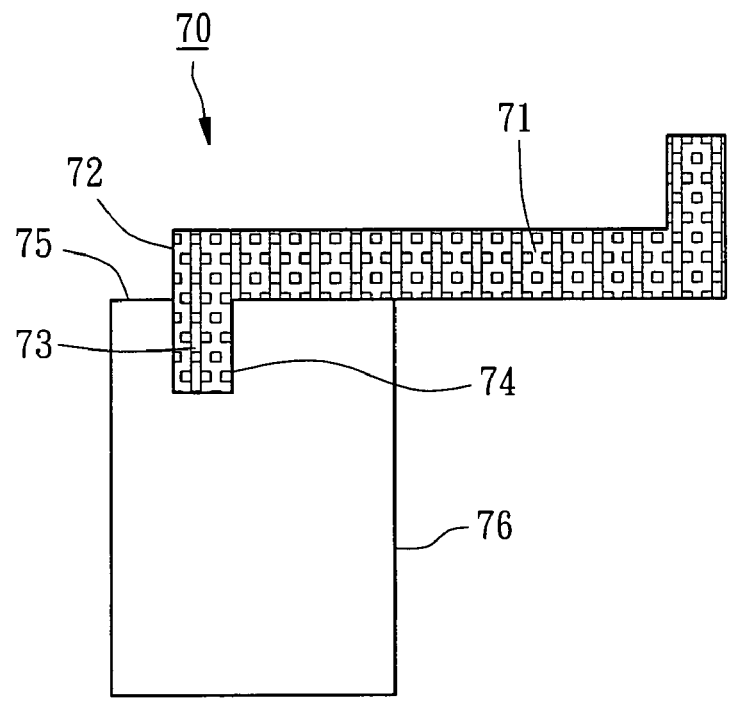
FIG. 16 is a sectional view in part of a sixth preferred embodiment of the present invention, showing the connection of the probes and the base.
Figure 17:
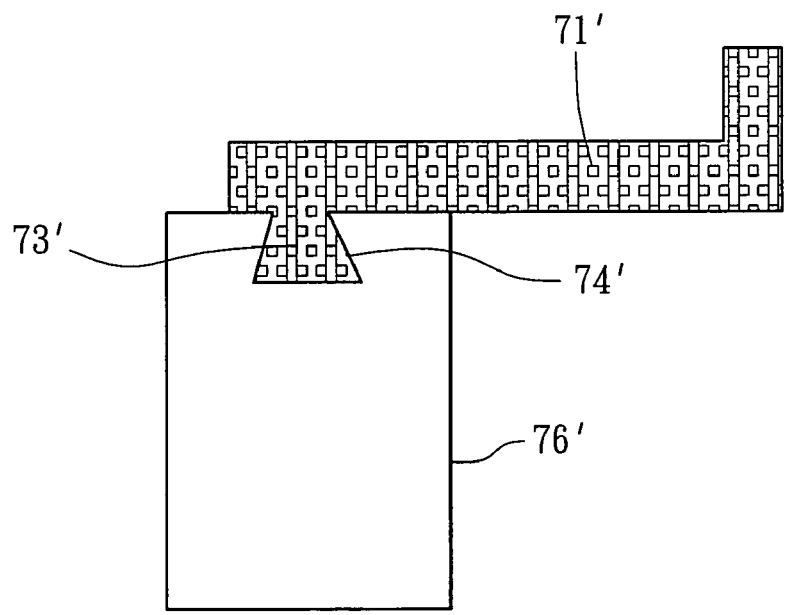
FIG. 17 is a sectional view of an application of the sixth preferred embodiment of the present invention.

FIG. 16 shows an electrical contact device 70 of the sixth preferred embodiment of the present invention, where probes 71 have vertical coupling portions 73 at first ends 72 thereof and anchored portions 74, as a concave on the top side 75, engaged with the vertical coupling portions 73 for partially embedding the probes 71 in a base 76. As shown in FIG. 17 similar to the sixth preferred embodiment, coupling portions 731 of probes 711 have substantially trapezoid cross-sections, and positions 741 are complementary to the coupling portions 731. It also partially embeds the probes 711 in a base 761.

The present invention provides the probe structures using the contacting portions touching the pads of the chip. Within a permitted tolerance of the dimension of probe, a temporary base can be use to provide with tip portions by micro-electroforming process individually, and then, the tip portions are connected to the contacting portions. The micro-electroforming process includes the compression casting, the electroforming in the photo-resist molding, and the electroforming in the etched space of the tip shape on a temporary base. Meanwhile, the contacting portions can be also made by chemical etching, precision machining, laser machining, and discharged machining on the probe directly.

Figure 18:
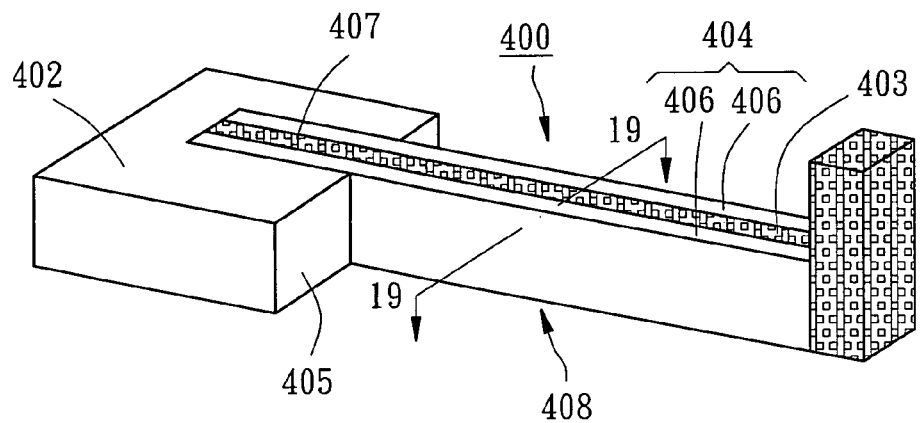
FIG. 18 is a perspective view in part of a seventh preferred embodiment of the present invention.
Figure 19:
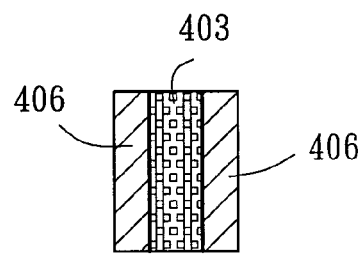
FIG. 19 is a sectional view along the 19-19 line of FIG. 18.

To enlarge the contact areas of each probe and the base and the structure strength of the probes, as shown in FIG. 18 and FIG. 19, the seventh preferred embodiment of the present invention provides an electrical contact device 400 including a base 402 and at least a probe 403. The character is that the base 402 has at least an extending portion 404, which is formed on a sidewall 405 of the base 402 by etching process. The extending portion 404 has two separated lateral walls 406 extending toward a cavity 408 from an anchored portion 407. The probe 403 is formed between the lateral walls 406 of the extending portion 404 to enlarge the contact area of the probe 407 and the base 402. In the same time, the material structure of the extending portion 404 can be utilize to increase the structure strength of the probe 403 that is suspended over the cavity 408. When the base 402 is not made of an insulating material, a dielectric layer, such as silicon dioxide, should be provided among the probe 403, the base 402 and the extending portion 404 to insulate the probe 403 from the base 402.

Figure 20:
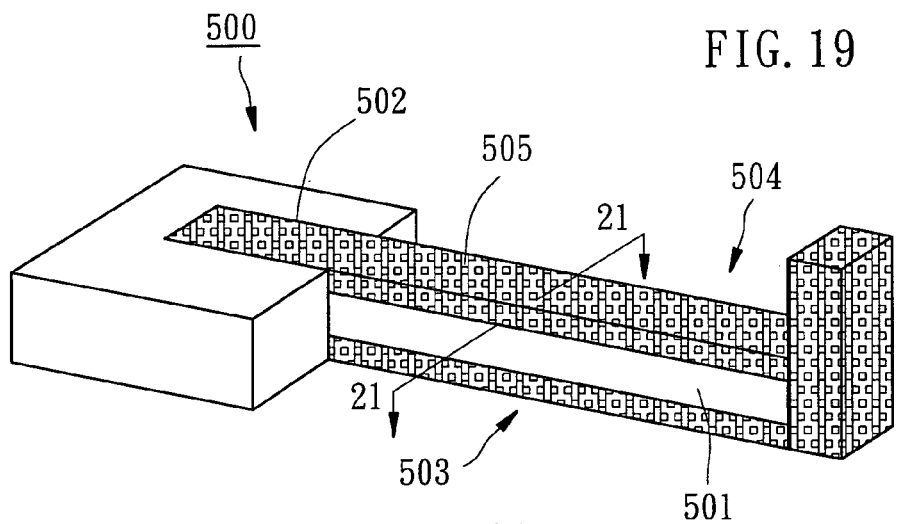
FIG. 20 is a perspective view in part of an eighth preferred embodiment of the present invention.
Figure 21:
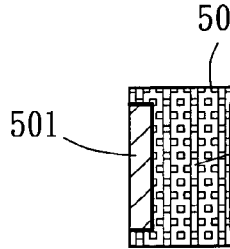
FIG. 21 is a sectional view along the 21-21 line of FIG. 20.
Figure 22:
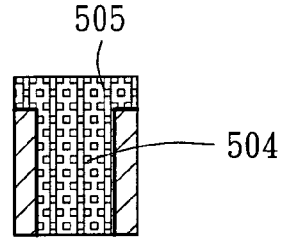
FIG. 22 is a sectional view of an application of the eighth preferred embodiment of the present invention.
Figure 23:
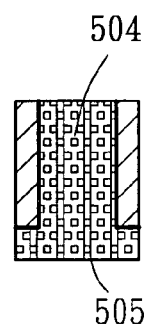
FIG. 23 is a sectional view of another application of the eighth preferred embodiment of the present invention.

As shown in FIG. 20 and FIG. 21, the eighth preferred embodiment of the present invention provides an electrical contact device 500, which is similar to the electrical contact device 400 of the seventh preferred embodiment, except a probe 504 formed by the electroforming process encloses the top side and the bottom side of the extending portion 501 extended from an anchored position 52 and creates two head portions 505 on a top and a bottom thereof. The head portions 505 can further enlarge the structure strength of the probe 504 as well. FIG. 22 and FIG. 23 show the head portion 505 can either on the top or at the bottom of the probe 504.

Figure 24:
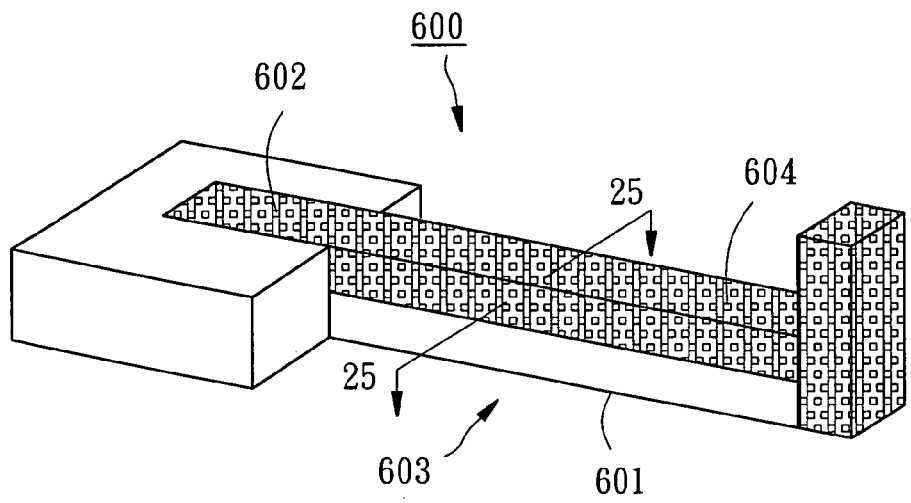
FIG. 24 is a perspective view in part of a ninth preferred embodiment of the present invention.
Figure 25:
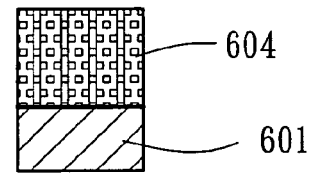
FIG. 25 is a sectional view along the 25-25 line of FIG. 24.

As shown in FIG. 24 and FIG. 25, an electrical contact device 600 of the ninth preferred embodiment of the present invention, which is similar to the electrical contact device 400 of the seventh preferred embodiment, includes an extending portion 601 extended from a bottom of a anchored portion 602 to a cavity 603, and a probe 604 is provided on a top of the extending portion 601.

Figure 26:
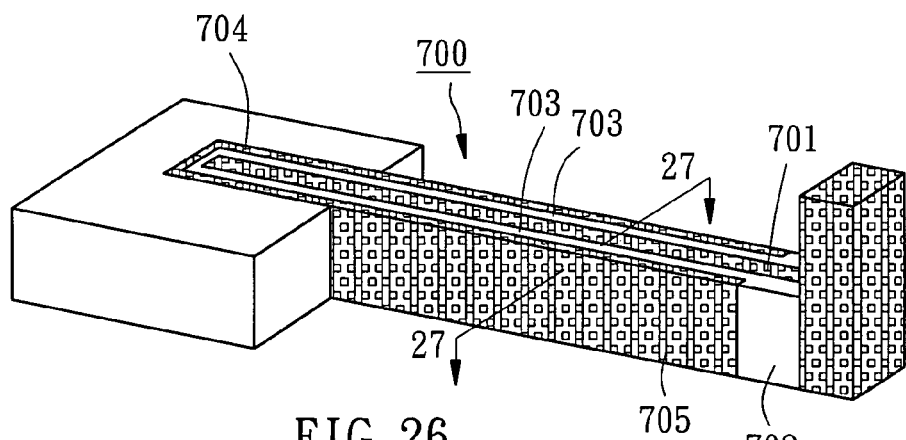
FIG. 26 is a perspective view in part of a tenth preferred embodiment of the present invention.
Figure 27:
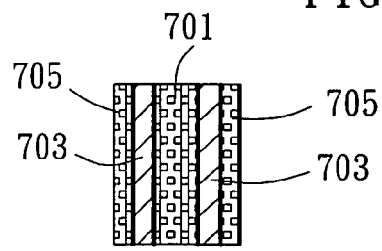
FIG. 27 is a sectional view along the 27-27 line of FIG. 26.
Figure 28:
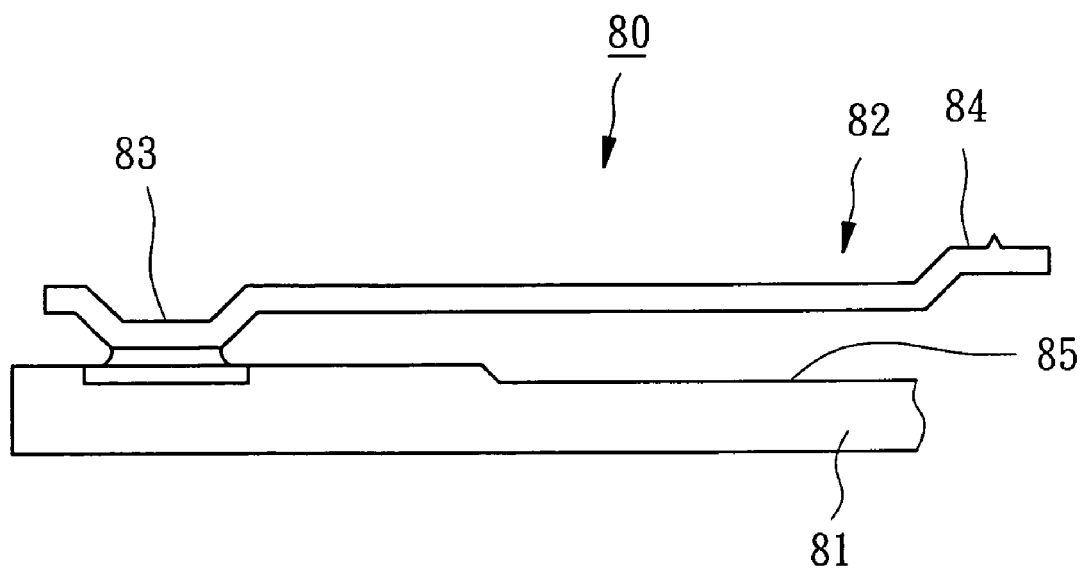
FIG. 28 is a sectional view of the prior art of electrical contact device.
Figure 29:
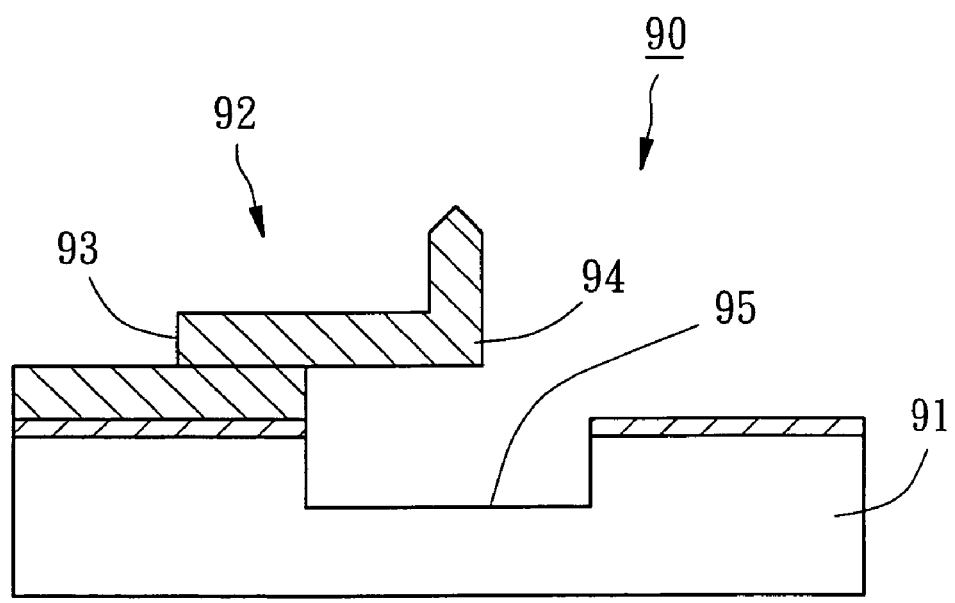
FIG. 29 is a sectional view of another prior art of electrical contact device.

As shown in FIG. 26 and FIG. 27, an electrical contact device 700 of the tenth preferred embodiment of the present invention, which is similar to the electrical contact device 400 of the seventh preferred embodiment, includes a probe 701 provided between two lateral walls 703 of an extending portion 702. The character is that a conductive portion 705 is provided between exterior sides of the lateral walls 703 and an anchored portion 704. The probe 701 can transfers signals, and the conductive portion 705 is for ground connection to block the noise and to increase the bandwidth of the signal transfer.

What is claimed is:

1. An electrical contact device of a probe card, comprising:
a base having a top side, said base being provided with a cavity that extends from said top side, said cavity having sidewalls transverse to said top side, and said base having a plurality of anchoring portions each extending from said top side and a respective sidewall; and
a plurality of probes each having a first end and a second end, wherein the first end is secured in a respective anchoring portion, and the second end extends across the cavity, wherein
each said probe has a main portion that extends between said first and second ends in direction substantially parallel to said top side to constitute a cantilever beam, and each said probe has, at said second end, a contacting portion that extends substantially perpendicular to said main portion; and
said cavity extends a sufficient distance from said top side to permit free deflection of said cantilever beam when said contact device is in use.

2. The electrical contact device as defined in claim 1, wherein each anchoring portion is a recess in the sidewall and the top side of the base.

3. The electrical contact device as defined in claim 2, wherein the base has at least a protrusion on a lateral side of the anchoring portion and the probe has at least an indentation at the first end to be engaged with said protrusion.

4. The electrical contact device as defined in claim 2, wherein the first end of the probe has a cross-section complementary to said anchoring portion.

5. The electrical contact device as defined in claim 2, wherein the base has at least a recess on a lateral side of the anchoring portion, which is substantially parallel to the top side of the base, and the probe has at least a flange to be engaged with the recess to bond the probe to the base.

6. The electrical contact device as defined in claim 5, wherein the probe has a head portion on a top or at a bottom thereof, which is substantially parallel to the flange engaged with the cavity of the base.

7. The electrical contact device as defined in claim 2, wherein the anchoring portion has an irregular cross-section, and the probe is complementary to the anchoring portion.

8. The electrical contact device as defined in claim 1, wherein the cavity is open at opposite sides of the base.

9. The electrical contact device as defined in claim 1, wherein the cavity of the base has a first sidewall and a second sidewall protruded from the first sidewall.

10. The electrical contact device as defined in claim 1, wherein the base has at least an extending portion extended toward the cavity, and the probe is bonded to the anchoring portion and the extending portion.

11. The electrical contact device as defined in claim 10, wherein the extending portion has two separated lateral walls, in between which the probe is formed.

12. The electrical contact device as defined in claim 10, wherein the extending portion is set in the anchoring portion and extended toward the cavity, on a top or at a bottom of which the probe is provided.

13. The electrical contact device as defined in claim 12, wherein the probe has a head portion at least one side.

14. The electrical contact device as defined in claim 10, wherein a conductive portion is provided between the extending portion and the anchoring portion for ground connection.

15. An electrical contact device of a probe card, comprising:
- a base having a top side, said base being provided with a cavity that extends from said top side, said cavity having sidewalls transverse to said top side, and said base having a plurality of anchoring portions each extending from said top side and a respective sidewall each anchoring portion being a recess on the side also; and
- a plurality of probes each having a first end and a second end, wherein the first end is bonded to a respective anchoring portion and the second end extends cross the cavity, wherein
- each said probe has a main portion that extends between said first and second ends in a direction substantially parallel to said top side to constitute a cantilever beam, and each said probe has, at said second end, a contacting portion that extends substantially perpendicular to said main portion; and
- said cavity extends a sufficient distance from said top side to permit free deflection of said cantilever beam when said contact device is in use.

16. The electrical contact device as defined in claim 15, wherein the base has at least a protrusion on a lateral side of the anchoring portion and the probe has at least an indentation at the first end to be engaged with the protrusion.

17. The electrical contact device as defined in claim 15, wherein the first end of the probe has a cross-section complementary to that of the anchoring portion.

18. The electrical contact device as defined in claim 15, wherein the base has at least a recess on a lateral side of the anchoring portion, which is substantially parallel to the side of the base and the probe has at least a flange to be engaged with the recess for bonding the probe to the base.

19. The electrical contact device as defined in claim 18, wherein the probe has a head portion on a top or at a bottom thereof, which is substantially parallel to the flange to be engaged with the cavity of the base.

20. The electrical contact device as defined in claim 10, wherein the anchoring portion has an irregular cross-section, and the probe is complementary to the anchoring portion.

21. The electrical contact device as defined in claim 10, wherein the cavity is open at opposite sides of the base.

22. A method of making an electrical contact device, comprising the steps of:
a. providing a base with a top side and a bottom side;
b. forming a first space on the top side of the base;
c. using photolithography and micro-electroforming process in the first space and the top side of the base to form probes, wherein each of the probes has a first end and a second end with a contacting portion above;
d. etching the bottom side of the base to form a second space, wherein a location of the second space is under the second ends of the probes; and
e. removing the sacrifice layers to release the probes on the base, wherein the probes have the first ends connected to the base and the second ends extended toward the second space.

23. The method as defined in claim 22, wherein the base is made of silicon material, silicon on insulator base, dielectric base, or a base with a dielectric material on a surface thereof.

24. The method as defined in claim 22, further comprising the step of providing a dielectric material between the base and the probes to enhance the insulation among the probes after the step b.

25. The method as defined in claim 22, wherein the step d forms a cavity and defines the second sidewall receding from the first sidewall by using a first etching process from the top side of the base to form the first sidewall and a second etching process from the bottom of the base to form the second sidewall.

26. The method as defined in claim 22, wherein an etching process or a laser process is applied in the step b.

* * * * *